United States Patent [19]
Chambliss et al.

[11] Patent Number: 6,015,632
[45] Date of Patent: *Jan. 18, 2000

[54] SELF-ASSEMBLED GIANT MAGNETORESISTANCE LATERAL MULTILAYER FOR A MAGNETORESISTIVE SENSOR

[75] Inventors: David Darden Chambliss, Katonah, N.Y.; Robin Frederick Charles Farrow, San Jose, Calif.; Ronald Franklin Marks, San Jose, Calif.; Eric Dean Tober, San Jose, Calif.

[73] Assignee: International Business Machines Corporation, Armonk, N.Y.

[*] Notice: This patent is subject to a terminal disclaimer.

[21] Appl. No.: 08/947,653

[22] Filed: Oct. 9, 1997

[51] Int. Cl.$^7$ ............ B32B 15/01; B32B 15/04; B32B 15/18; G11B 5/39
[52] U.S. Cl. ............ 428/692; 428/679; 428/687; 428/693; 428/337; 360/113; 365/158
[58] Field of Search .................. 428/632, 650, 428/651, 660, 663, 678, 679, 681, 682, 673, 665, 687, 692, 693, 337, 672; 324/207.21, 252; 360/113, 122; 365/8, 158; 29/603.01, 603.07; 338/322, 32 R

[56] References Cited

U.S. PATENT DOCUMENTS

| | | | |
|---|---|---|---|
| 5,589,278 | 12/1996 | Kamijo | 428/611 |
| 5,648,885 | 7/1997 | Nishioka et al. | 360/113 |
| 5,764,445 | 6/1998 | Torng et al. | 360/113 |
| 5,780,176 | 7/1998 | Iwasaki et al. | 428/692 |
| 5,818,323 | 10/1998 | Maeda et al. | 338/32 R |
| 5,858,455 | 1/1999 | Chambliss et al. | 427/131 |
| 5,867,025 | 2/1999 | Allenspach et al. | 324/252 |

OTHER PUBLICATIONS

S. Araki, "Magnetism and Transport Properties of Evaporated Co/Ag Multilayers", Journal of Applied Physics, vol. 73, No. 8, Apr. 15, 1993, pp. 3910–3916.

R. Q. Hwang, "Chemically Induced Step Edge Diffusion Barriers: Dendritic Growth in 2D Alloys", Physical Review Letters, vol. 76, No. 25, Jun. 17, 1996, pp. 4757–4760.

J. M. Millunchick et al., "Spontaneous Lateral Composition Modulation in III–V Semiconductor Alloys", MRS Bulletin, Jul. 1997, pp. 38–42.

S.S.P. Parkin et al., "Oscillations of Interlayer Exchange Coupling and Giant Magnetoresistance in (111) Oriented Permalloy/Au Multilayers", Physical Review Letters, vol. 72, No. 23, Jun. 6, 1994, pp. 1162–1164.

S.S.P. Parkin et al., "Low Field Giant Magnetoresistance in Sputtered Permalloy/Au Multilayers", Applied Physics Letters, vol. 68, No. 8, Feb. 19, 1996, pp. 1162–1164.

(List continued on next page.)

*Primary Examiner*—John J. Zimmerman
*Assistant Examiner*—Michael LaVilla
*Attorney, Agent, or Firm*—Thomas R. Berthold

[57] ABSTRACT

A magnetoresistive sensor based on a giant magnetoresistance multilayer uses a multilayer structure formed of alternating layers or stripes of ferromagnetic and nonferromagnetic metal that are spontaneously formed or "self-assembled" laterally on a special template layer. The template layer is a crystalline structure that has a two-fold uniaxial surface, i.e., one that is structurally invariant for a rotation by 180 degrees (and only 180 degrees) about an axis (the symmetry axis) perpendicular to the surface plane. Such a template layer is the (110) surface plane of body-centered-cubic Mo. The alternating stripes of ferromagnetic metal (such as Co or Fe) and nonferromagnetic metal (such as Ag) become spontaneously arranged laterally on the template layer during co-deposition, such as during ultrahigh vaccum evaporation, and are aligned so that the direction of composition modulation, i.e., the direction perpendicular to the alternating stripes is along one of the unique axes of the template layer and in a plane parallel to the template layer. A crystalline base layer may be used beneath the template layer to enhance the growth of the template layer. If the template layer is (110) Mo, then the base layer may be sapphire having its (1 1 2bar 0) plane parallel to the (110) Mo plane.

13 Claims, 6 Drawing Sheets

OTHER PUBLICATIONS

P.A. Schroeder et al., "Perpendicular Magnetoresistance in Ag/Co and Cu/Co Multilayers", Magnetism and Structure in Systems of Reduced Dimension, Plenum Press, 1993, pp. 129–142. (no month).

X.Z. Wang et al., "Magnetostatic Modes of Lateral–magnetic–superlattice Films in a Transverse Field", Journal of Physics: Condensed Matter, vol. 9, 1997, pp. 5777–5786. (no month).

C.T. Yu et al., "Giant Magnetoresistance in Fe/Ag Multilayer", Chinese Science Bulletin, vol. 39, No. 20, Oct. 1994, pp. 1680–1683.

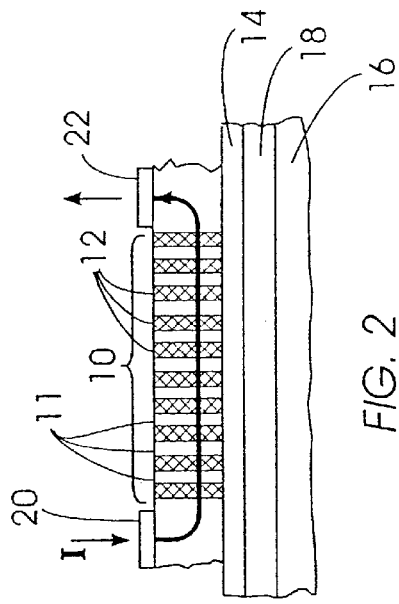
FIG. 1A (PRIOR ART)
FIG. 1B (PRIOR ART)
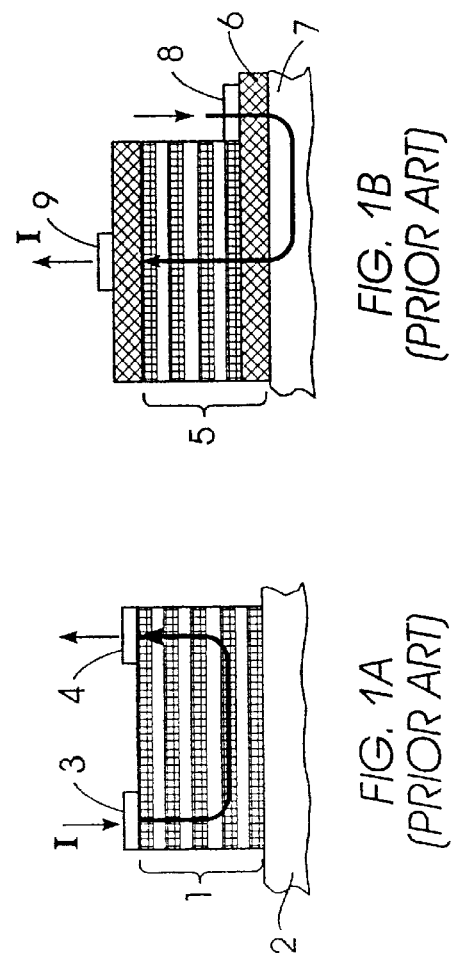
FIG. 2
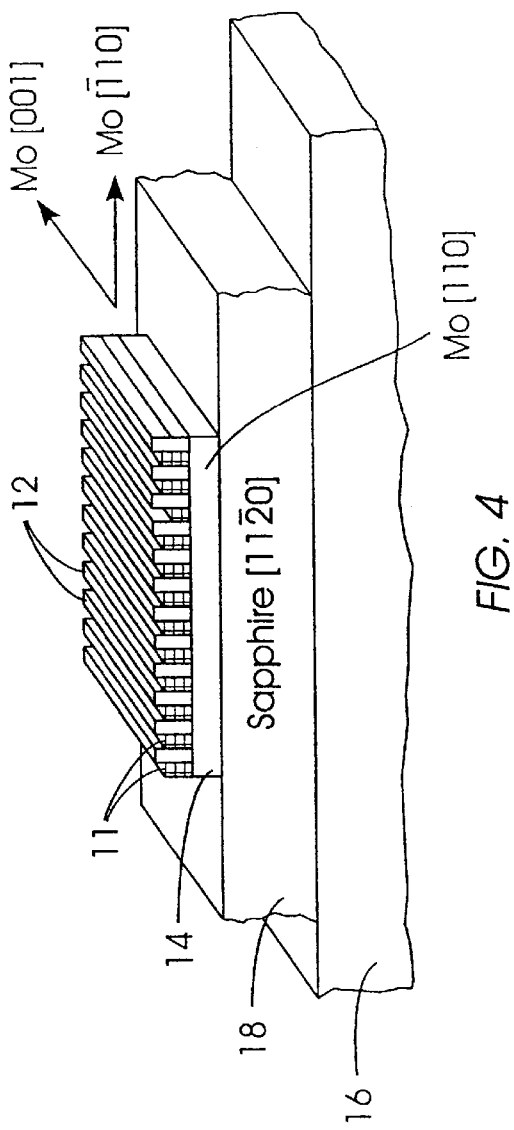
FIG. 4

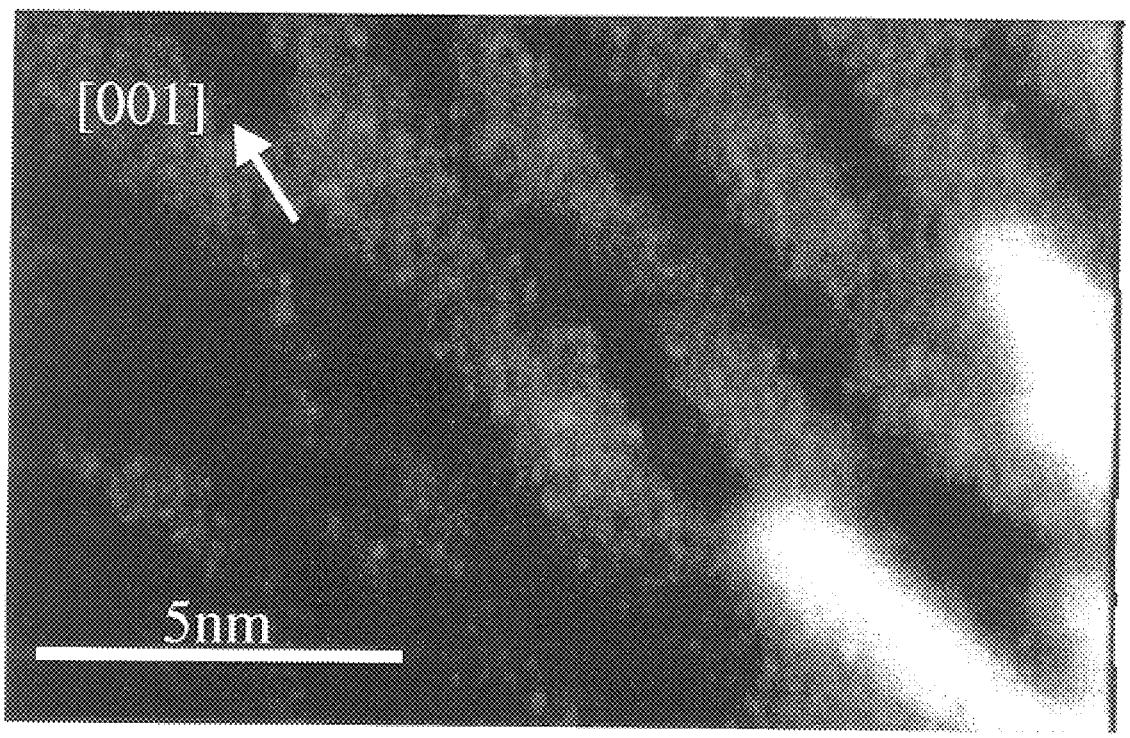
Fig. 6 STM constant current micrographs of 2.4 monolayer thick $Co_xAg_{1-x}$ (x=0.48) SALM grown on Mo(110).

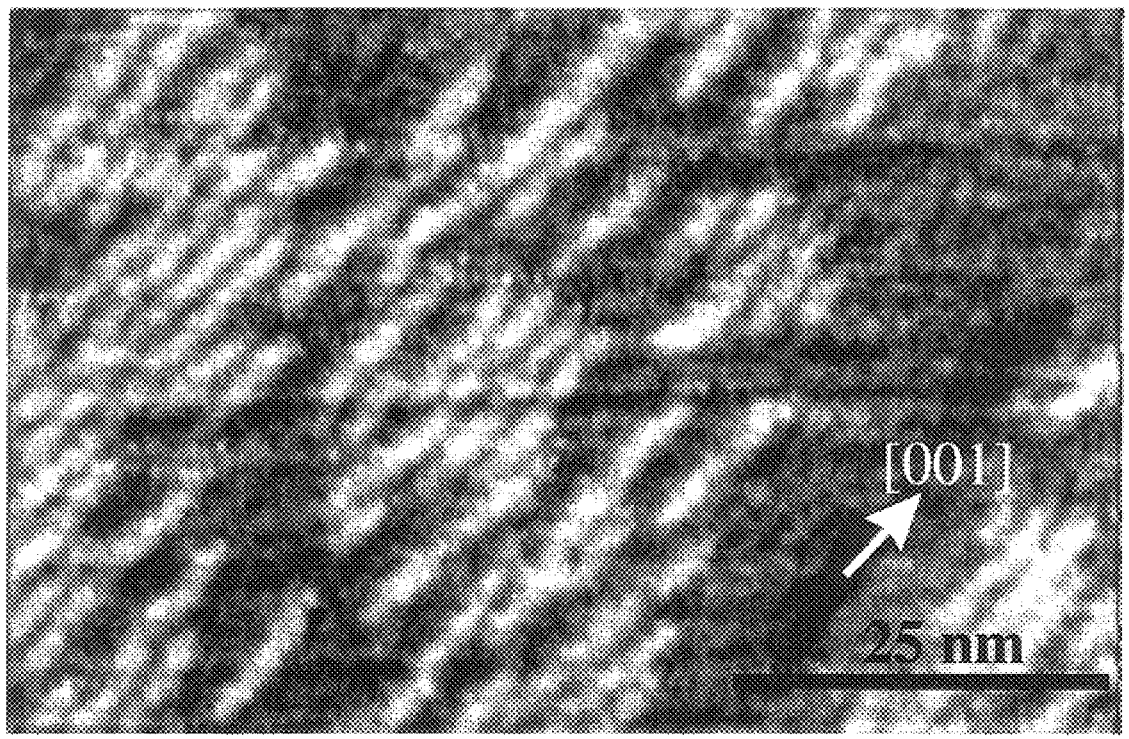
Fig. 7 STM constant current micrograph of 2.5 monolayer $Fe_xAg_{1-x}$ SALM (x=0.50) grown on Mo(110).

SELF-ASSEMBLED GIANT MAGNETORESISTANCE LATERAL MULTILAYER FOR A MAGNETORESISTIVE SENSOR

RELATED APPLICATION

This application is related to concurrently filed application Ser. No. 08/946,948 filed Oct. 9, 1997, now U.S. Pat. No. 5,858,455.

TECHNICAL FIELD

This invention relates to magnetoresistive (MR) sensors, such as those used in magnetic recording disk drives, and more particularly to an MR sensor based on the giant magnetoresistance (GMR) effect.

BACKGROUND OF THE INVENTION

Conventional magnetoresistive (MR) sensors, such as those used in magnetic recording disk drives, operate on the basis of the anisotropic magnetoresistive effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, called giant magnetoresistance (GMR), has been observed in a variety of magnetic multilayered structures, the essential feature being at least two ferromagnetic metal layers separated by a nonferromagnetic metal layer. The physical origin of the GMR effect is that the application of an external magnetic field causes a variation in the relative orientation of the magnetic moments in neighboring ferromagnetic layers. This in turn causes a change in the spin-dependent scattering of conduction electrons and thus the electrical resistance of the structure. The resistance of the structure thus changes as the relative alignment of the magnetic moments of the ferromagnetic layers changes.

GMR in conventional artificial multilayer structures that are formed of alternating layers of ferromagnetic and non-ferromagnetic metals can be described by two basic geometries. In the first, as depicted in FIG. 1a, the multilayer 1 is formed vertically on a substrate 2 and the applied electrical current is supplied in the plane of the multilayer 1 from electrical lead 3 to electrical lead 4. The leads 3, 4 are defined by conventional lithography on the top of the multilayer 1. In the second, as depicted in FIG. 1b, the the multilayer 5 is formed formed vertically on a conductive layer 6 on substrate 7 and the electrical current is supplied between leads 8 and 9 to flow perpendicular to the interfaces between the ferromagnetic and nonferromagnetic layers of the multilayer. The structure of FIG. 1b requires lithographic isolation of small-dimension vertical columns in the multilayer stack so that current is carried predominantly by electrons which retain spin polarization between the neighboring ferromagnetic layers. There are several problems with both of the structures of FIGS. 1a and 1b. Because the individual layers must be formed sequentially one on top of the other to form the vertical stack of layers it is difficult to obtain the relatively precise thickness required to assure antiferromagnetic coupling between adjacent ferromagnetic layers across the intermediate nonferromagnetic layer. It is also difficult to make electrical connection from the wiring patterns that are formed on the substrate to the lead or leads on the top of an isolated multilayer stack. In addition, the total magnetic thickness of the multilayer, which is directly related to the sensitivity of the sensor, needs to be limited to support increased linear density of recorded data. Consequently there is a severe limit to the number of bilayers in the multilayers depicted in FIGS. 1a and 1b.

What is needed is a GMR multilayer structure that is relatively easy to fabricate and does not have the number of its layers limited by the need to achieve a high linear data density.

SUMMARY OF THE INVENTION

The invention is a magnetoresistive sensor based on a giant magnetoresistance multilayer wherein the multilayer is a structure of alternating layers or stripes of ferromragnetic and nonferromagnetic metal that are spontaneously formed or "self-assembled" laterally on a special template layer. The template layer is a crystalline structure that has a two-fold uniaxial surface, i.e., one that is structurally irvariant for a rotation by 180 degrees (and only 180 degrees) about an axis (the symmetry axis) perpendicular to the surface plane. Such a template layer is the (110) surface plane of body-centered-cubic Mo. The alternating stripes of ferromagnetic metal (such as Co or Fe) and nonferromagnetic metal (such as Ag) become spontaneously arranged laterally on the template layer during co-deposition, such as during ultrahigh vacuum evaporation, and are aligned so that the direction of composition modulation, i.e., the direction perpendicular to the alternating stripes is along one of the unique axes of the template layer and in a plane parallel to the template layer. A crystalline base layer may be used beneath the template layer to enhance the growth of the template layer. If the template layer is (110) Mo, then the base layer may be sapphire having its (1 1 2bar 0) plane parallel to the (110) Mo plane.

For a fuller understanding of the nature and advantages of the present invention, reference should be made to the following detailed description taken together with the accompanying figures.

BRIEF DESCRIPTION OF THE DRAWING

FIGS. 1a and 1b show two prior art GMR multilayer structures, respectively.

FIG. 2 shows the lateral GMR multilayer structure of the present invention.

FIG. 4 is a perspective view of the GMR multilayer structure of the present invention as formed on a crystalline template layer showing the crystalline planes and directions of the template layer.

FIG. 6 is a scanning tunneling microscope (STM) micrograph or image of a $Co_xAg_{1-x}$ GMR multilayer of the present invention.

FIG. 7 is a scanning tunneling microscope (STM) micrograph or image of a $Fe_xAg_{1-x}$ GMR multilayer of the present invention.

DESCRIPTION OF THE PREFERRED EMBODIMENTS

Figure 3:
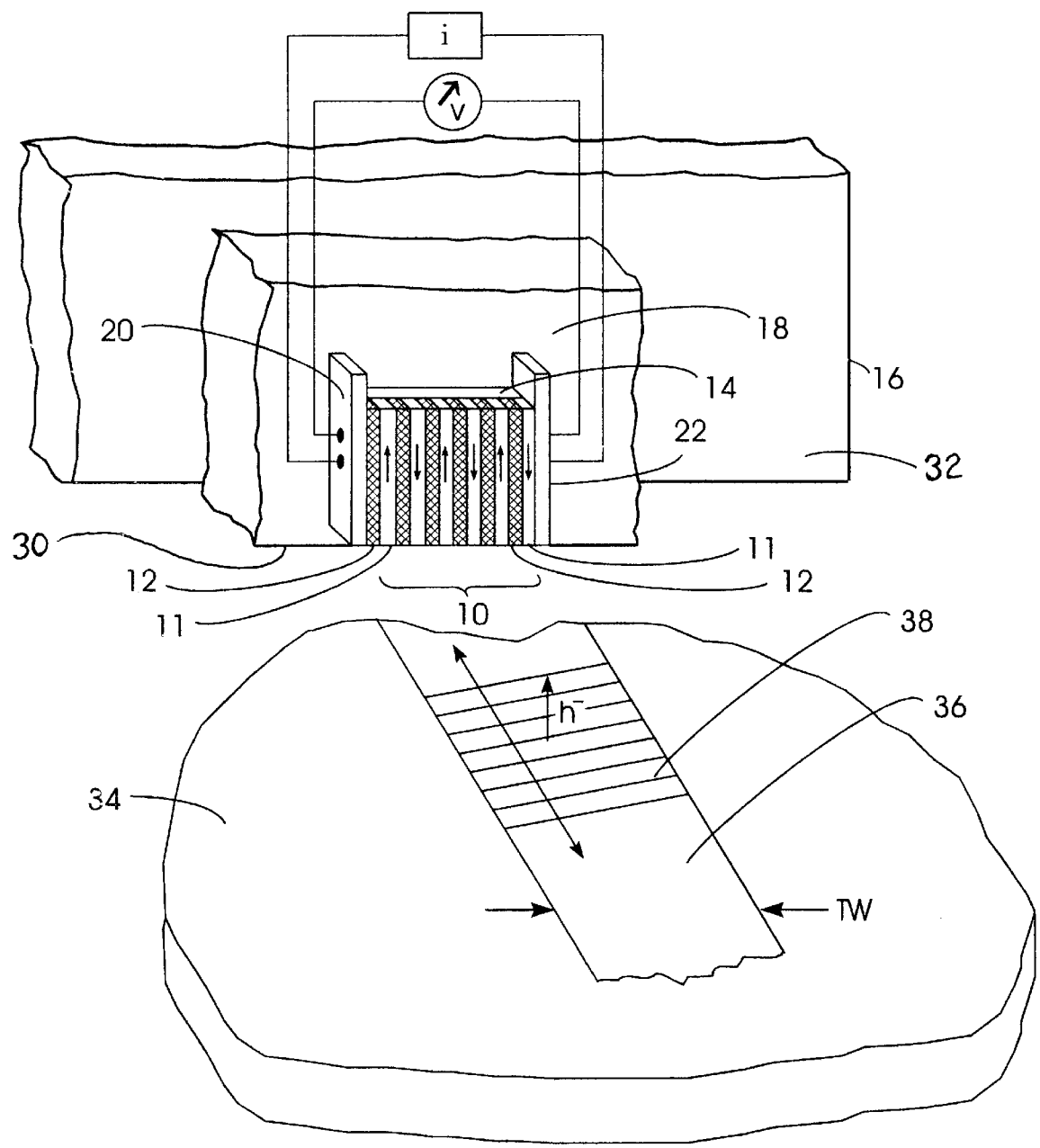
FIG. 3 is a perspective view of a MR read head with the GMR multilayer structure of the present invention shown relative to a data track of a magnetic recording disk.

FIG. 2 depicts a schematic of the GMR lateral multilayer sensor according to the present invention. Because the multilayer is formed spontaneously or "self-assembled" using the method described below, the structure is referred to as a self-assembled lateral multilayer (SALM). The SALM structure 10 comprises alternating layers or stripes of ferromagnetic metal or alloy 11 and layers or stripes of nonferromagnetic metal or alloy 12, thereby creating many interfaces at which spin-dependent electroin scattering can occur. Unlike the multilayer structures of FIGS. 1a–1b that have vertical stacks of layers, the alternating stripes of the SALM are arranged laterally on the substrate. The SALM 10 is deposited on a template layer 14 that is a planar layer with uniaxial structural symmetry such that a two-fold axis is perpendicular to its surface. The template layer is formed of material that is substantially immiscible with the materials used for layers 11, 12. The preferred template layer 14 is the (110) surface of a body-centered-cubic (bcc) Mo crystalline layer. The template layer 14 is formed on substrate 16, which may be the body of the read head carrier, such as the air-bearing slider in a magnetic recording disk drive. An optional crystalline base layer 18 may be located between the template layer 14 and substrate 16. In contrast to the prior art structures of FIGS. 1a–1b, the structure of the present invention as depicted in FIG. 2 allows for current transport perpendicular to the ferromagnetic and nonferromagnetic layers of the GMR multilayer, while still permitting the electrical leads 20, 22 to be located at the ends of the SALM and patterned on the substrate using standard lithographic techniques. In addition, because the stripes 11, 12 are stacked in a direction parallel to the surface of the substrate, the number of layers is limited only by the track width of the data on the medium, rather than by the individual bit size. Thus the number of layers in the SALM is not limited by the need for a high linear bit density. A further benefit is that a single layer can be formed on the SALM which has direct contact with all ferromagnetic regions in the SALM. This layer, if made of an appropriate antiferromagnetic or other suitable biasing-type material, can serve to bias the magnetization of these ferromagnetic regions in the absence of an external field so that the sensor's response can be linearized and optimized.

FIG. 3 is a perspective view of a MR read head with the SALM 10 formed on substrate 16, where substrate 16 is shown as an air-bearing slider having a generally planar sensing surface 30 and a generally planar support surface 32. The sensing surface 30 faces the medium, depicted as a magnetic recording disk 34 with a data track 36 having individual magnetic transitions or bits 38 that produce small magnetic fields h in a direction generally perpendicular to the sensing surface 30 of the air-bearing slider.

The template layer 14 is sufficiently thin and resistive that only a small fraction of the current supplied across leads 20, 22 is shunted through it. Adjacent to template layer 14 is crystalline base layer 18, also preferably electrically insulating, which both supports and helps to define the crystalline orientation of template layer 14. Base layer 18 is formed directly on and supported by the support surface 32 of substrate 30. Above or in front of the SALM 10 may be a magnetic bias layer (not shown) comprised of a ferrimagnet, hard ferromagnet or antiferromagnet which couples sufficiently to the ferromagnetic stripes 11 to define a preferred magnetic anisotropy axis and/or offset in magnetoresistive response when the sensor experiences no external magnetic field from the magnetic data storage disk 34. If employed, the bias layer must be sufficiently resistive or sufficiently electrically isolated that little of the current passes through it. Arrows in the ferromagnetic stripes 11 depict one possible configuration of spin orientations in zero external field when adjacent ferromagnetic stripes 11 are coupled antiparallel by either magnetostatic or exchange coupling. Also depicted in FIG. 3 are a current source 40 and a voltage sensing circuit 42 which provide the magnetoresistive response when the SALM 10 of the MR read head structure receives magnetic fields h from the disk 34.

It can be appreciated from the schematic of FIG. 3 that the SALM 10 embodies the characteristics of a GMR multilayer sensor with current passing predominantly perpendicular to the interfaces of layers 11, 12 but still employs in-plane electrical contact geometry and essentially uniform magnetic biasing. Because this sensor structure may be employed in a magnetoresistive sensor for use in a system with magnetic transitions 38 occurring along the direction of data track 36 the number of periods (the number of bilayers of ferromagnetic and nonferromagnetic stripes) in the multilayer is defined by the track width (TW) of the medium and not by the linear density of bits along the track 36.

The present invention is based on the discovery that a lateral magnetic multilayer of the type shown schematically in FIGS. 2–3 may be produced spontaneously or essentially "self-assembled". In the preferred method for producing the SALM, this self-assembly of the ferromagnetic and nonferromagnetic material into the alternating stripes occurs during the co-deposition of Ag and Co (or Ag and Fe) onto a bcc Mo (110) template layer 14 that has been grown epitaxially onto the a-plane of crystalline sapphire (1 1 2bar 0) that serves as base layer 18. This is shown schematically in FIG. 4. As used herein [hkl] is used to denote a specific crystalline direction and (hkl) is used to denote a specific crystalline plane. The [1bar 1 0] direction in FIG. 4 is the direction perpendicular to the alternating stripes and parallel to the (110) plane of the substrate, a direction that can be referred to as the direction of composition modulation because it is the direction in which the composition of the SALM alternates or is modulated between ferromagnetic and nonferromagnetic stripes. The Mo template layer 14 can be approximately 3 nm thick. The formation of this self-assembled structure occurs over a range of 30 to 60 atomic percent of ferromagnetic material in the ferromagnet/Ag composition (which for Fe—Ag is optimal at approximately 50 atomic % Fe). Over the composition range where such structures form, the period of the lateral multilayer (the total thickness of a bilayer comprised of a single ferromagnetic layer and a single nonferromagnetic layer) is in the range of approximately 1.8 to 2.3 nm. Hence the resulting Ag spacer thickness is approximately 1 nm. This thickness corresponds to a local maximum for the formation of antiparallel Fe or Co spins for conventional Fe/Ag or Co/Ag exchange-coupled multilayers. It is known that there is a preferred antiferromagnetic coupling layer thickness at which ferromagnetic layers spaced by a nonferromagnetic coupling layer become strongly antiferromagnetically coupled. This oscillatory coupling relationship for selected material combinations is described by Parkin et al. in *Phys. Rev. Lett.*, Vol.64, p. 2034 (1990). The relationship for Fe and Ag is described in "Giant Magnetoresistance in Fe/Ag Multilayer", Yu Cheng-Tao, Li Shu-Xiarg, Yan Ming-Lang, Ku Wan-Jun, Yin Lin, Wang Yi-Zhong, Lai Wu-Yan, Wang Zhen-Xi, *Chinese Science Bulletin*, 39 (20), pp 1680–1683 (1994); and the relationship for Co and Ag is described in "Magnetism and Transport Properties of Evaporated Co/Ag Multilayers", S. Araki, *J. Appl. Phys.* 73 (8), 3910 (1993). Since the mean Ag spacer thickness in the SALM can be varied slightly by altering the ferromagnet/Ag relative composition, the coupling strength between adjacent ferromagnetic layers may thus be optimized.

The spontaneous formation of the SALM on Mo (110) is believed to be initiated by anisotropic strain between the Mo and the overlying metal multilayer, and is retained as the multilayer grows, due in part to the limited miscibility of the ferromagnetic and nonferromagnetic materials chosen. While Ag is the preferred nonferromagnetic metall layer, Au or Au—Ag alloys may also be used. It is known that in conventional GMR multilayers prepared by either ultrahigh vacuum (UHV) evaporation or sputtering, Au may yield a greater GMR for relatively weak external magnetic fields. This is described in "Oscillations of Interlayer Exchange Coupling and Magnetoresistance in (111) Oriented Permalloy/Au Multilayers", S. S. P. Parkin, R. F. C. Farrow, R. F. Marks, A. Cebollada, G. R. Harp, R. J. Savoy, *Phys. Rev. Lett.*, 72, 3718 (1994); and "Low field giant magetoresistance in sputtered permalloy/Au multilayers", S. S. P. Parkin, T. A. Rabedeau, *Appl. Phys. Lett.* 68 (8), 1162 (1996).

As previously described, the SALM is a lateral multilayer of regularly alternating stripes of ferromagnetic material (metal A) and nonferromagnetic material (metal B) with an average stripe width of roughly 0.5 to 2.0 nm, depending on the overall stoichiometry (the atomic ratio of type A metal to type B metal present). The SALM is preferably produced by simultaneous co-deposition on a bcc template (110) surface (the [110] crystallographic direction being normal to the surface plane). The preferred template layer is the Mo (110) surface. It is possible to form the SALM on both bulk Mo (110) single crystals and on thin Mo (110) films that have been grown epitaxially on clean a-plane (1 1 2bar 0) sapphire that has a polished surface within approximately 0.5° of the (1 1 2bar 0) plane. The Mo (110) template layer is typically about 3 nm thick and is grown in UHV conditions (P<1×10$^{-9}$ Torr) by molecular beam epitaxy (MBE) onto sapphire (1 1 2bar 0) substrates maintained at approximately 700° C. A post-deposition anneal at 900–1000° C. for approximately 5 min. in UHV is usually required to produce a well ordered, atomically flat Mo (110) surface on which the SALM can be grown.

Figure 5:
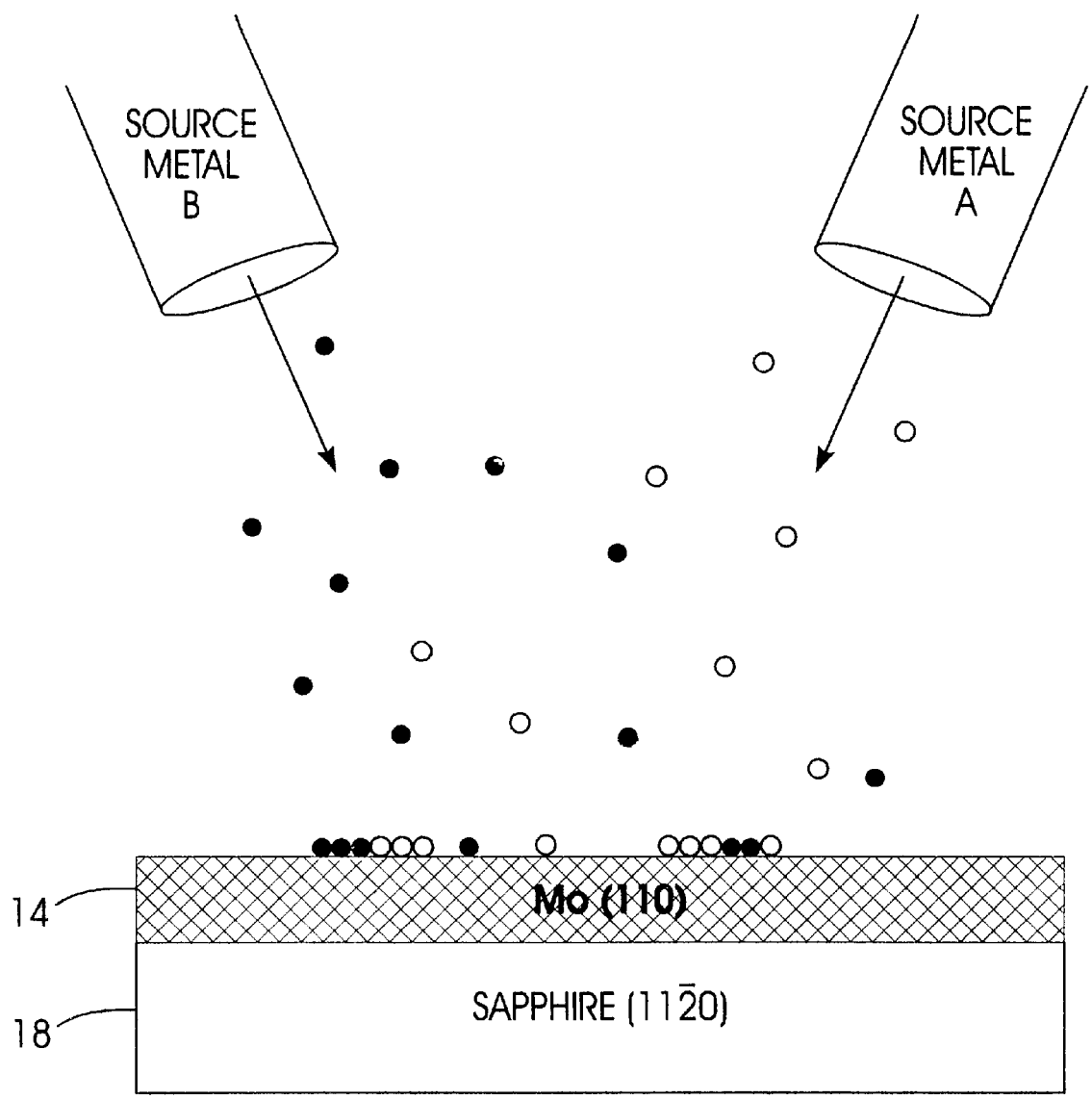
FIG. 5 is a schematic showing the simultaneous codeposition of the ferromagnetic (metal A) and nonferromagnetic (metal B) materials that results in the self-assembly of the GMIR multilayer into alternating stripes of metal A and metal B.

Having achieved a good quality template layer, the SALM is then formed by co-evaporating two immiscible metals A and B onto the template layer to create the thin film alloy $A_xB_{1-x}$ (where x indicates the atomic fraction of metal A present in the film). FIG. 5 shows a schematic diagram of the co-deposition process and resulting SALM. Two immiscible metal systems have been demonstrated: $Co_xAg_{1-x}$ and $Fe_xAg_{1-x}$. Other substantially immiscible systems that may be capable of forming SALM structures include $Co_xAu_{1-x}$ and $Fe_xAu_{1-x}$. The SALM structure may also be extended to include alloys A and B, as long as alloy A is immiscible with alloy B. The present technique of generating a SALM by self-assembly of the two metals A and B into the alternating stripes involves evaporation in UHV onto a Mo (110) template layer maintained at approximately 25–200° C. at a rate of approximately 0.005 nm/sec of material in total. Typically, metal A and B are evaporated simultaneously at rates chosen to achieve the desired stoichiometry (the variable "x"). Deposition rates may be determined through the use of quantitative Auger electron spectroscopy or proton induced X-ray emission (PIXE) analysis.

While simultaneous co-evaporation is the preferred method, it has been found that SALMs can also be generated by sequentially depositing first metal B and then metal A to complete each atomic layer individually. For example, one may deposit first the equivalent of 0.5 monolayers of Ag and then the equivalent of 0.5 monolayers of Fe, forming one complete atomic layer of the SALM. This process can then be repeated until the desired thickness is achieved. However, this requires an elevated temperature of at least approximately 200° C. for the template layer to enhance surface mobility of the deposited ferromagnetic and nonferromagnetic material.

Figure 8A:
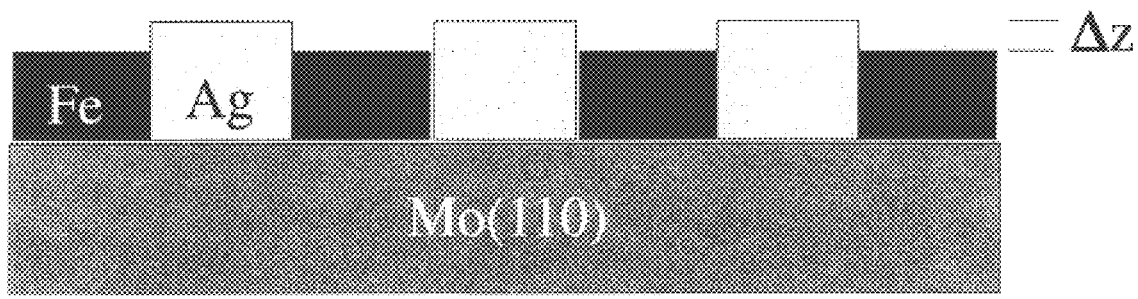
FIG. 8a is a schematic cross-section of the GMR multilayer of the present invention showing the relative height variation Δz between the A and B metal stripes of a $Fe_xAg_{1-x}$ GMR multilayer.
Figure 8B:
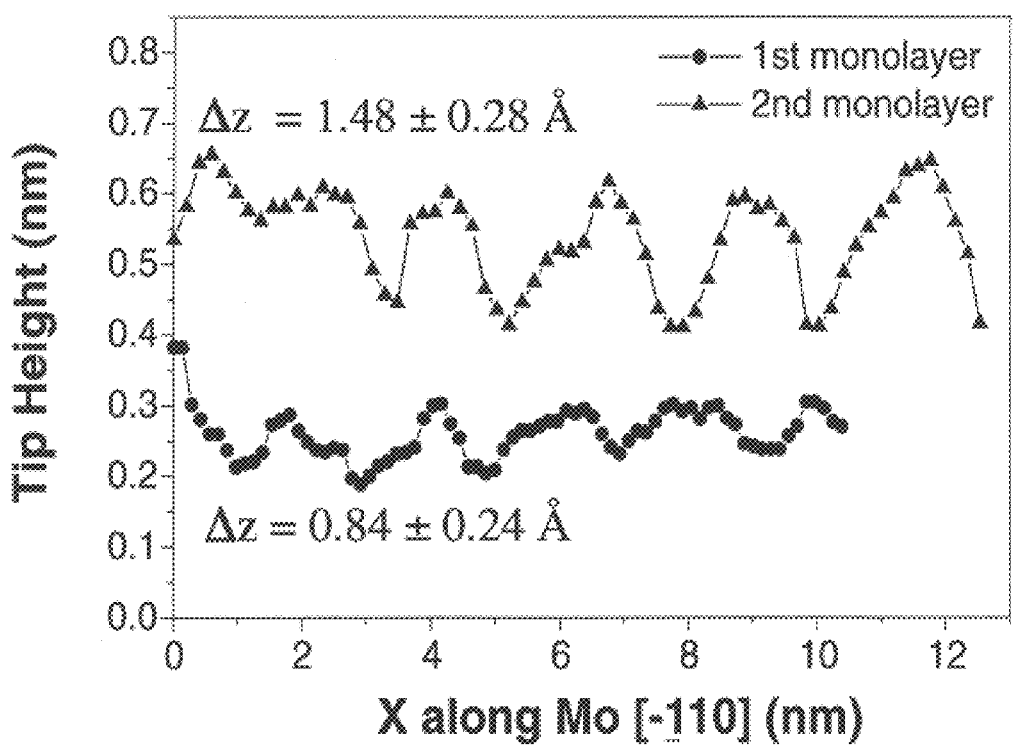
FIG. 8b are graphs of STM data for different film thicknesses showing the actual Δz height variation for the $Fe_xAg_{1-x}$ GMR multilayer of the present invention along the Mo [1 bar 1 0] direction of the Mo template layer.

Scanning tunneling microscope (STM) images of $Co_xAg_{1-x}$ and $Fe_xAg_{1-x}$ SALMs are shown in FIGS. 6 and 7, respectively. The compositional ordering of metals A and B into stripes substantially parallel to the Mo [001] direction (perpendicular to the composition modulation direction) in the template layer is clearly shown in both STM images. The relative height variation $\Delta z$ between the A and B metal stripes is shown in the schematic cross-section of FIG. 8$a$. FIG. 8$b$ shows the actual $\Delta z$ height variations for different film thicknesses for the $Fe_xAg_{1-x}$ SALM as seen by the STM along the Mo [1 bar 1 0] direction (perpendicular to the stripes and parallel to the Mo (110) surface). FIG. 8$b$ shows this variation for both the first and second monolayers of Fe and Ag. The observed height variation $\Delta z$ with increased film thickness indicates that the stripes are predominantly of a single metallic type throughout the structure vertically.

While the preferred template layer surface is the (110) plane of bcc Mo, other suitable template layers are any that are structurally uniaxial with a two-fold symmetric axis that is generally perpendicular to the substrate support surface on which the template layer is formed. A two-fold uniaxial surface is a surface that is structurally invariant for a rotation by 180 degrees (and only 180 degrees) about an axis (the symmetry axis) perpendicular to the surface plane. These include surfaces whose symmetry is characterized by rectangular (non-square) or parallelogram surface elements. An example is the (110) plane of any cubic crystal since the unit cell of this plane is a rectangle with dimensions of A by A/sqrt2 (where the volumetric unit cell is cubic with lattice parameter A). Another example is the (1 0 1bar 0) surface of a hexagonal crystal that has rectangular symmetry with dimensions of A by C (where A and C are the lattice parameters of the volumetric unit cell).

While Co and Fe are the preferred materials for the ferromagnetic materials, it is likely that ferromagnetic alloys comprising two or more of Fe, Co and Ni may show good low-field performance when used as the ferromagnetic layers in the SALM. Suitable template layers may also be formed of Nb, Ta, and W or their binary or ternary alloys, as well as alloys of Mo. It is likely that different material choices, not necessarily limited to these, may yield different template/SALM strains and hence different SALM periods. Bias layers may include those materials commonly employed as; bias materials in "spin valve" GMR sensors. These include NiO (which is an insulating material) and NiMn antiferromagnets and/or suitable hard ferromagnetic (e.g., CoPt alloys) or ferrimagnetic materials, such as gamma-$Fe_2O_3$ or $Mn_2Sb_3$.

In the demonstration of SALM formation, UHV evaporation of the ferromagnetic and nonferromagnetic layers has been employed. However, sputter deposition under suitable conditions provides adequate mobility of surface atoms to permit epitaxial growth of metal films. The same mobility is expected to be sufficient for SALM formation, so that the deposition process for a SALM may employ suitable magnetron sputtering or other techniques.

It is straightforward to include a separate layer of magnetic biasing material to offset the magnetoresistive response from zero external field to some nonzero field and to thus linearize the response to external fields. Other deliberate methods of biasing a SALM may be adopted from well-known methods used in magnetoresistive head design, as described, for example, in *Magneto-Resistive Heads, Fundamentals and Applications*, pp. 37–56 and 103–109, J. C. Mallinson, Academic Press, 1996. Also, it is possible that a separate bias layer may not be needed.

The development of uniaxial magnetic anisotropy in a SALM structure will depend upon the internal strain of the layers, their dimensions, the spacing between them, and the materials at the interfaces. Thus it is likely that this anisotropy can be tuned by choice of materials and growth conditions, including external magnetic fields during growth or annealing.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

What is claimed is:

1. A magnetoresistive sensor comprising:
   a substrate having a substantially planar sensing surface and a substantially planar support surface generally perpendicular to the sensing surface for supporting layers of material in sensor;
   a structurally uniaxial crystalline template layer formed on the support surface of the substrate and having a two-fold symmetry axis generally perpendicular to the support surface of the substrate;
   a multilayer formed on the uniaxial template layer and comprising alternating layers of a ferromagnetic material and a nonferromagnetic material selected from the group consisting of Ag, Au and alloys formed of Au and Ag, the composition modulation direction of the alternating layers being substantially parallel to the uniaxial template layer; and
   a first electrical lead at one end of the multilayer and a second electrical lead at the other end of the multilayer, whereby electrical current may be passed from the first electrical lead perpendicularly through the alternating layers of the multilayer to the second electrical lead.

2. The sensor according to claim 1 wherein the ferromagnetic material is selected from the group consisting of Fe, Co, Ni and alloys formed of one or more of Fe, Co and Ni.

3. The sensor according to claim 1 wherein the ferromagnetic material is Co or Fe and the nonferromagnetic material is Ag.

4. The sensor according to claim 1 wherein the material forming the template layer is selected from the group consisting of Mo, Nb, Ta, W and their alloys.

5. The sensor according to claim 4 wherein the material forming the template layer is Mo.

6. The sensor according to claim 1 further comprising a crystalline base layer located between the support surface of the substrate and the template layer for enhancing the formation of the template layer.

7. The sensor according to claim 6 wherein the template layer is Mo and the base layer is sapphire having its (1 1 2bar 0) plane generally parallel to the (110) plane of the Mo layer.

8. The sensor according to claim 1 wherein the sensor is a magnetoresistive read head for sensing data magnetically recorded on a medium when connected to sense circuitry, wherein the uniaxial template layer is a body-centered-cubic crystalline template layer having its (110) crystalline plane oriented generally parallel to the support surface of the substrate, and wherein the composition modulation direction of the alternating layers of the multilayer is substantially along the [1 bar 1 0] direction of the (110) crystalline plane of the template layer.

9. A magnetoresistive read head for sensing data magnetically recorded on a medium when connected to sense circuitry, the head comprising:
   a substrate having a substantially planar sensing surface for facing the medium and a substantially planar support surface generally perpendicular to the sensing surface for supporting layers of material in the read head;
   a crystalline base layer on the support surface of the substrate and having its (1 1 2bar 0) plane oriented generally parallel to the support surface of the substrate;
   a body-centered-cubic crystalline template layer formed on the (1 1 2bar 0) plane of the base layer and having its (110) crystalline plane oriented generally parallel to the (1 1 2bar 0) plane of the base layer;
   a multilayer formed on the (110) crystalline plane of the template layer and comprising alternating layers of a ferromagnetic material selected from the group consisting of Co, Fe, Ni and alloys formed of one or more of Co, Fe and Ni and a nonferromagnetic material consisting of Ag, the direction perpendicular to the ferromagnetic and Ag layers being substantially along the [1bar 1 0] direction of the (110) crystalline plane of the template layer; and
   a first electrical lead at one end of the multilayer and a second electrical lead at the other end of the multilayer, whereby electrical current may be passed from the first electrical lead perpendicularly through the ferromagnetic and Ag layers of the multilayer to the second electrical lead.

10. The head according to claim 9 wherein the ferromagnetic material is Co or Fe.

11. The head according to claim 9 wherein the material forming the template layer is selected from the group consisting of Mo, Nb, Ta, W and their alloys.

12. The head according to claim 11 wherein the material forming the template layer is Mo.

13. The head according to claim 9 wherein the base layer is sapphire.

* * * * *